United States Patent [19]

Wiegand

[11] 4,309,628
[45] Jan. 5, 1982

[54] PULSE GENERATION BY CHANGING MAGNETIC FIELD

[75] Inventor: John R. Wiegand, Valley Stream, N.Y.

[73] Assignee: The Echlin Manufacturing Company, Branford, Conn.

[21] Appl. No.: 123,703

[22] Filed: Feb. 22, 1980

[51] Int. Cl.³ .............................................. H03K 3/45
[52] U.S. Cl. .................................. 307/419; 365/133; 310/152
[58] Field of Search ...................... 307/419; 365/133; 310/154, 155, 156, 152

[56] References Cited

U.S. PATENT DOCUMENTS

| | | | |
|---|---|---|---|
| 3,780,313 | 12/1973 | Wiegand | 365/133 |
| 3,820,090 | 6/1974 | Wiegand | 365/133 |
| 4,150,314 | 4/1979 | Zabler et al. | 310/156 |
| 4,157,482 | 6/1979 | Kakinuma | 310/155 |

*Primary Examiner*—James W. Moffitt
*Attorney, Agent, or Firm*—McAulay, Fields, Fisher, Goldstein & Nissen

[57] ABSTRACT

A pulser unit is composed of two high strength magnets spaced apart from one another and establishing an intense magnetic field therebetween. Forward faces of the two magnets establish a working surface for the pulser unit. A Wiegand wire module consisting of a Wiegand wire segment around which a pickup coil is wound is mounted in the pulser unit immediately behind the working surface of the pulser unit and adjacent the sides of the two spaced apart magnets. The magnetic field is sufficiently strong to determine the state of the Wiegand wire. When a low reluctance element is brought adjacent to the front of the working surface, the field is substantially distorted and the field to which the Wiegand wire is subjected changes materially. The result is that the Wiegand wire switches state and the substantial rate of change of the flux in that switching of state is sensed by the pickup coil to provide an output pulse. Similarly, removal of the low reluctance element causes the field to revert so that the wire switches state back thereby inducing an output pulse in the pickup coil. The pulser can conveniently be kept stationary while the actuating low reluctance element is moved past the working face of the pulser.

13 Claims, 9 Drawing Figures

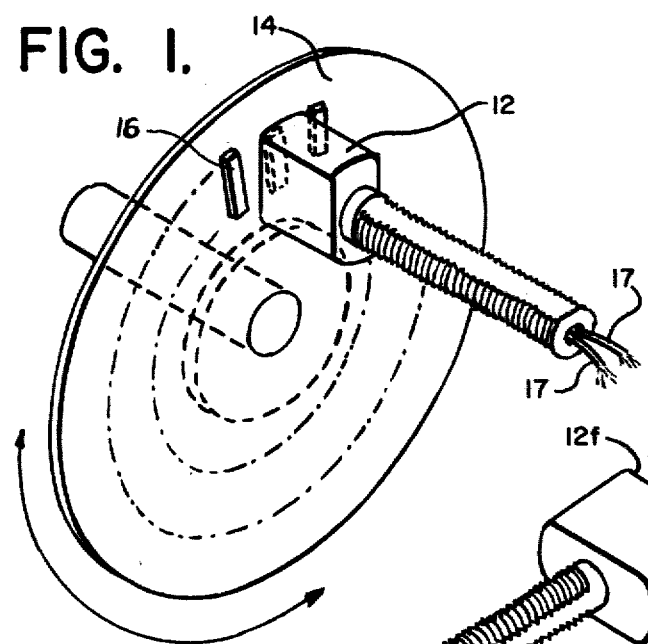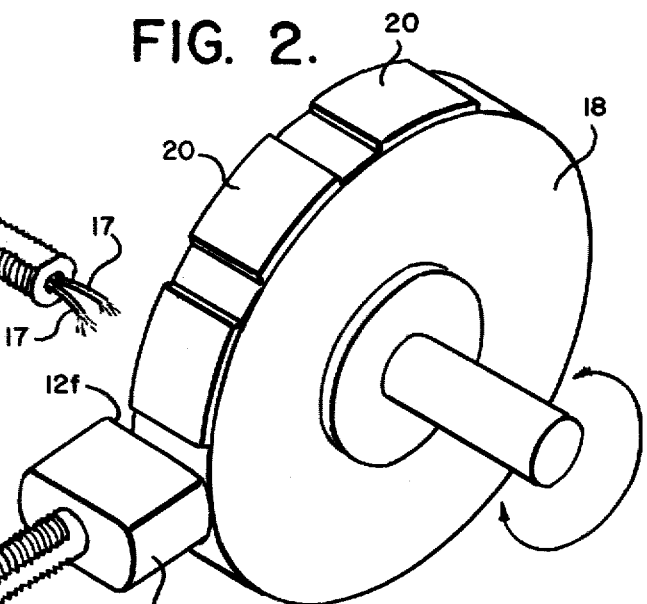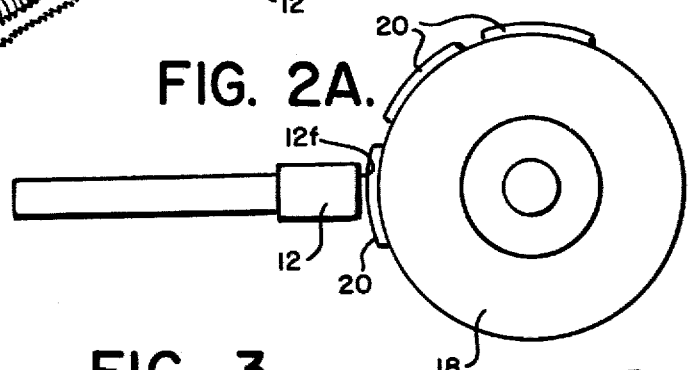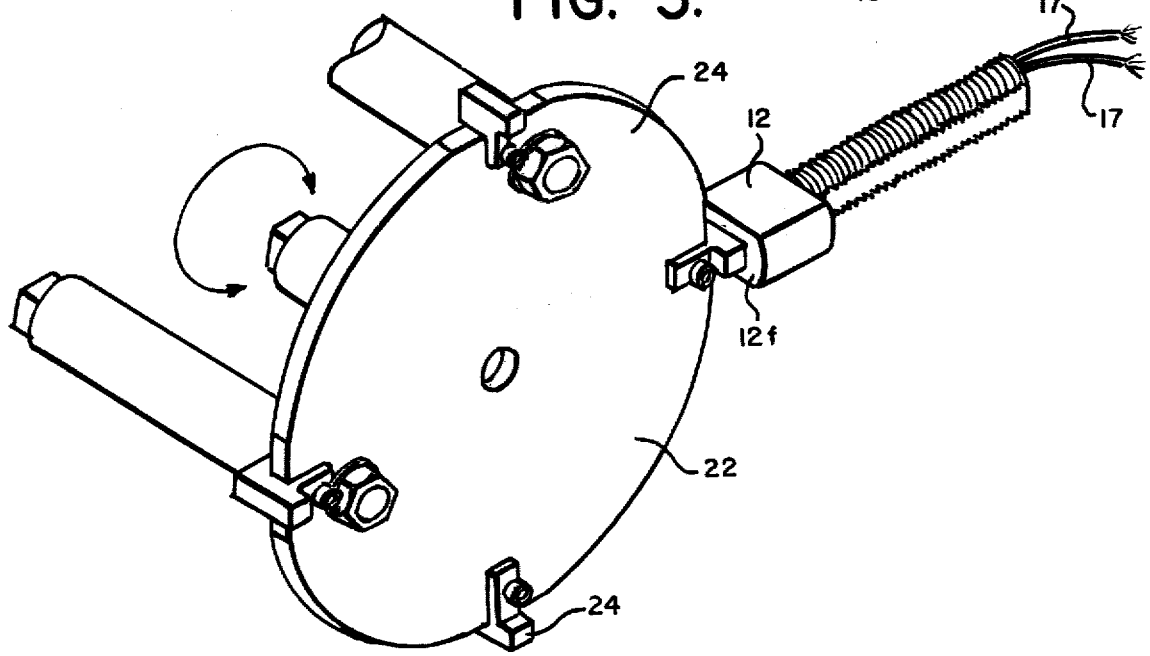

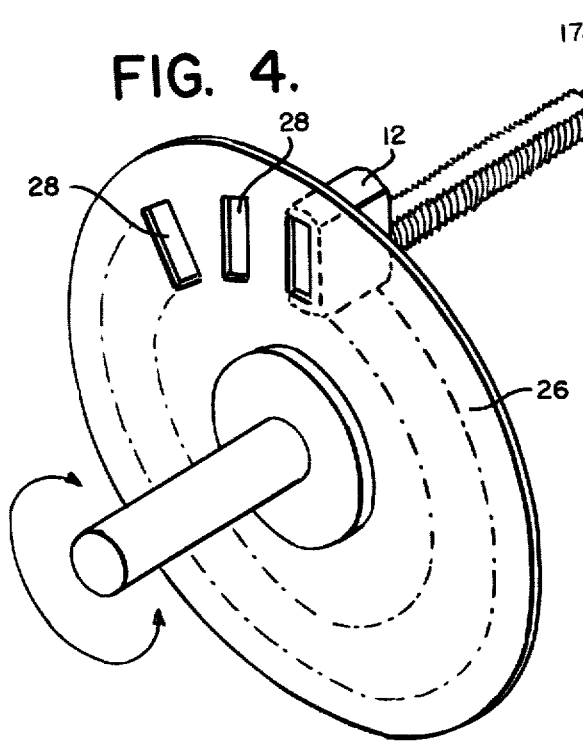
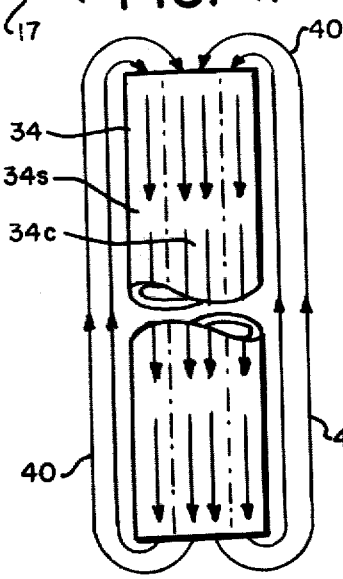
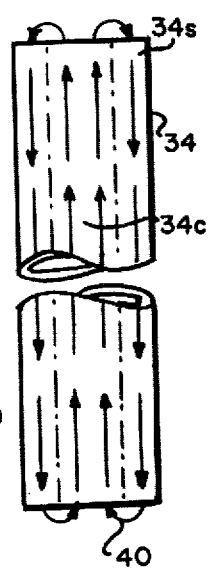
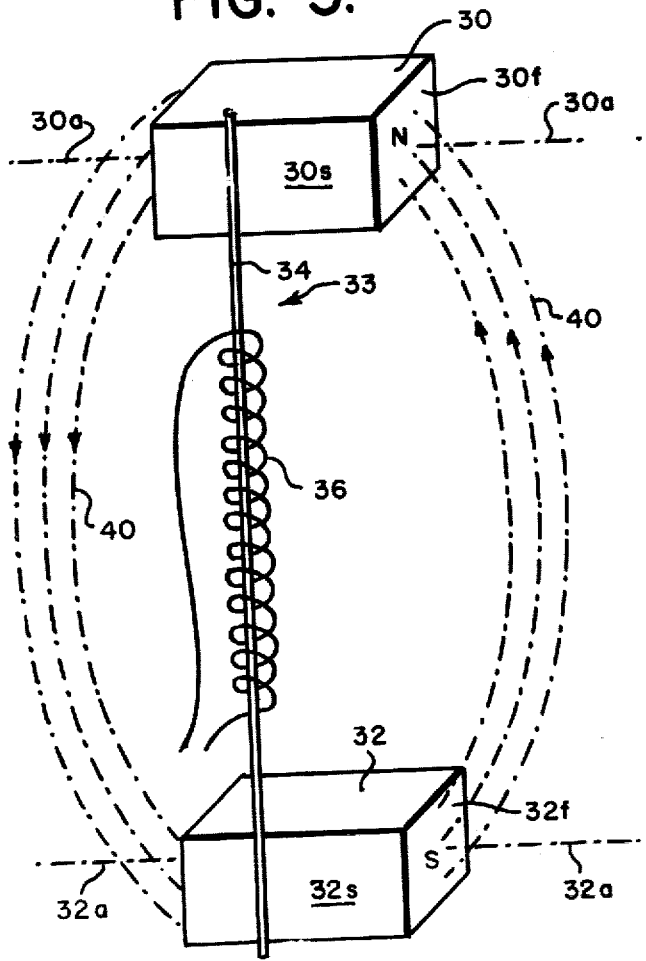
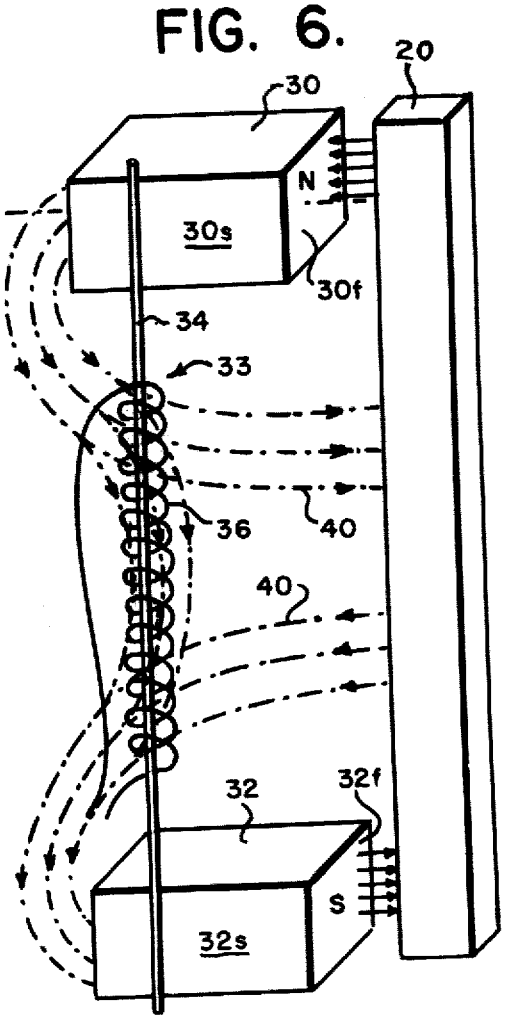

PULSE GENERATION BY CHANGING MAGNETIC FIELD

BACKGROUND OF THE INVENTION

This invention relates in general to a mechanism for generating a pulse by switching the state of a magnetic device that has come to be known as a Wiegand wire and more particularly to a mechanism and method for affecting the magnetic field to which a Wiegand wire module is subjected so as to provide a reliable and repeatable output pulse upon the occurrence of a predetermined event.

The magnetic device employed in the pulser of this invention is of the type disclosed in U.S. Pat. No. 3,820,090 issued June 25, 1974. A preferred embodiment of this magnetic device is disclosed in co-pending application Ser. No. 897,483 filed Apr. 18, 1978, now U.S. Pat. No. 4,247,601 and entitled "Switchable Magnetic Device and Method of Manufacturing Same". These magnetic devices are ferro-magnetic wire segments which have been treated in such a fashion as to provide core and shell portions with divergent properties and in particular divergent coercivities. This type of wire has come to be known in the art as Wiegand wire.

The Wiegand wire essentially has two states. In one of these states, the magnetization of the core and shell are in opposite directions and this state may conveniently be called a reverse state. In the other state, the magnetization of the core and shell are in the same direction and this state may conveniently be called the confluent state. When the magnetic field to which the wire is subjected passes a threshold in one direction or the other, the wire switches state. The switch in state is extremely rapid so that the rate of change of flux through a pickup coil wrapped around the wire is great. As a consequence the output from the pickup coil is very substantial, in some cases being as high as 8 volts into an open circuit on a repeatable basis. The wire and pickup coil is referred to as a module.

Although certain techniques have been disclosed for switching the state of the Wiegand wire, some of these techniques have not been applied commercially in a wide range of applications because of consideration of costs or size.

Accordingly, it is a major purpose of this invention to provide a highly versatile pulser and pulsing arrangement employing a Wiegand wire module.

It is a related purpose to provide such a versatile item in a device that is simple and is relatively inexpensive to produce and to maintain.

It is another related purpose to provide the characteristics of low cost and versatility while maintaining the reliability and repeatability of result that has been provided with previously known pulse generating mechanisms employing the Wiegand wire.

Because the output pulse has to be taken off the pickup coil, it is preferable that the module, consisting of Wiegand wire segment and pickup coil, be stationary in the pulse generator and that the moving element be some ferro-magnetic element. Thus one purpose of the invention is to provide a pulser design in which the output pulse can be developed without moving the pulser unit.

BRIEF DESCRIPTION

In brief, in one embodiment of this invention, a stationary pulser unit has first and second spaced apart magnets which are aligned with one another so that their axes of magnetization are parallel to one another but opposite in direction. These two magnets are small high strength magnets preferably made of a rare earth cobalt such as samarium cobalt. Thus, they establish a relatively intense field between them. The Wiegand wire module, which is essentially a Wiegand wire segment around which a pickup coil is wound, is positioned within the field between the two magnets. The outwardly facing north pole face of one of the two magnets and the outwardly facing south pole face of the other of the two magnets essentially define the plane of a working surface. The module is placed in the field such that the axis of the wire segment is orthogonal to the axis of the magnets and is adjacent to and parallel to the working surface of the magnets and also adjacent to and parallel to a side of each of the magnets.

When a low reluctance element is brought adjacent to and parallel to this working surface, the configuration of the intense magnetic field between the two magnets changes substantially. This change in the configuration of the magnetic field substantially changes the magnetic field to which the Wiegand wire is subjected and by proper positioning of the wire in the magnetic field, this change of field switches the state of the wire. When the low reluctance element is moved away, the field reverts to its initial state thereby again changing the state of the wire. As the wire changes state, the pickup coil on the wire provides an output pulse that can be used for any number of purposes such as counting the number of times that the low reluctance element is brought adjacent to the working surface of the pulser unit.

BRIEF DESCRIPTION OF THE FIGURES

FIG. 1 is a perspective view of one embodiment of the invention in which the pulser element is pulsed by proximity to ferrous protrusions on the face of a rotating ferrous disk.

FIG. 2 is a second embodiment in which the pulser is actuated by ferrous protrusions on the cylindrical surface of a rotating non-ferrous drum.

FIG. 2a is a cross-sectional view through the FIG. 2 embodiment illustrating the relative size and spacing involved.

FIG. 3 is a third embodiment of the invention illustrating an arrangement in which the pulser is pulsed by ferrous teeth attached to the rim of a ferrous or nonferrous rotating disk.

FIG. 4 is a fourth embodiment in which the pulser is caused to pulse by proximity to gaps punched in a rotating ferrous disk.

FIG. 5 is a schematic illustration showing the relationship between the magnets of the Wiegand module within the pulser unit.

FIG. 6 is a schematic illustration similar to that of FIG. 5 except that in FIG. 6 the field configuration is sketched in as it might appear when one of the protrusions of FIGS. 1 or 2 are adjacent to the working face of the pulser.

FIGS. 7 and 8 are schematic illustrations of the Wiegand effect exhibiting wire illustrating flux arrangement when in the confluent state (FIG. 7) where core and shell magnetization are in the same direction and when in the reverse state (FIG. 8) where core and shell magnetization are in the opposite directions.

DESCRIPTION OF THE PREFERRED EMBODIMENTS

FIGS. 1 through 4 illustrate four pulse generator embodiments each of which employ the same pulser unit 12. An electromagnetic schematic of the pulser unit 12 is shown in FIGS. 5 and 6.

VARIOUS PULSE GENERATOR EMBODIMENTS.

In FIG. 1 the working face of the pulser 12 is deployed adjacent to the face of a rotating disk 14. The disk 14 is a non-ferrous material on the face of which a plurality of ferrous modulators 16 are deployed as protrusions. As the disk 14 rotates, the working face 12f of the pulser 12 alternately is adjacent to a ferrous zone, defined by one of the protrusions 16, and a non-ferrous zone, which is essentially the open space between the protrusions 16. The existence of this ferrous (also called ferro-magnetic) material 16 provides a low reluctance path causing the flux configuration generated by the magnets within the pulser 12 to materially distort and thereby change the magnetic field which influences the Wiegand wire. This is discussed in somewhat further detail in connection with the discussion of FIGS. 5 and 6 below. Suffice to say for now that the magnetized Wiegand wire in the pulser 12 alternates between confluent state and reverse state as the alternate ferrous protrusions and gaps are presented to the working face of the pulser 12. The resultant field change is picked up by a pickup coil as a pulse on the output leads 17.

FIG. 2 illustrates another pulse generator embodiment in which a rotating non-ferrous drum 18 has ferrous low reluctance elements 20 deployed around the circumference of the drum. The ferrous elements 20 determine a low reluctance zone and the space between the elements 20 determine a high reluctance zone. The drum 18 is made of a non-ferrous material. As shown in FIG. 2a, the gap between the pulser 12 and the low reluctance elements 20 is kept small so that the effect of the elements 20 on distorting or modifying the magnetic field is as substantial as possible. In one embodiment, this gap between low reluctance element 20 and the working face 12f is approximately 1.3 millimeters. This gap, although small, is sufficiently great so as not to require expensive design to maintain tight tolerances thereby keeping construction costs of the system reasonable for a wide variety of application.

FIG. 3 illustrates a third embodiment of the pulse generator in which a ferrous or non-ferrous rotating disk 22 carries a series of ferrous lugs 24 protruding from the rim of the disk. As each lug 24 passes the working surface 12f of the pulser 12, a pulse output is produced at the leads 17.

FIG. 4 illustrates a fourth embodiment of the pulse generator structure in which a ferrous rotating disk 26 has a plurality of cut out or punched out zones 28. As the open, high reluctance zones 28 alternate with the low reluctance zones between the openings along the working face 12f of the pulser 12, the state of the Wiegand wire in the pulser 12 switches between its confluent and reverse states. Each switch produces an output pulse on the output wires 17 from the pulser 12.

THE PULSER

The operation of the pulser 12 can better be understood by reference to the electric and magnetic schematic illustrations in FIGS. 5 and 6. Two high energy magnets 30 and 32 are spaced from one another and in alignment such that their polar axes 30a, 32a are essentially parallel and such that a north pole face 30f of the first magnet and a south pole face 32f of the second magnet define the working surface 12f. In one embodiment, samarium cobalt magnets 30, 32 are employed; each magnet being a bit over 6 millimeters long and being a bit over 3 millimeters on a side. They have a center-to-center spacing of approximately 13 millimeters and thus establish a strong magnetic field between them.

A Wiegand wire module 33 comprising essentially a length of Wiegand wire 34 around which a pickup coil 36 is wrapped is deployed in the magnetic field generated by the two magnets 30, 32. The module 33, in the illustrated embodiment, is deployed so that it is behind the working surface 12f and is adjacent to and substantially parallel to both the working surface 12f and to the sides 30s, 32s of the magnets 30, 32. The wire 34, positioned adjacent to one side of each of the two magnets, in one embodiment, has a length of approximately 20 millimeters thereby extending slightly past the outboard sides of the two magnets 30, 32.

The pickup coil 36 in that embodiment is wrapped around a 12 millimeter central portion of the wire 34 and is constituted by 1,350 turns of No. 44 wire. This embodiment produces an output pulse on the leads 17 that is consistantly and reliably greater than one volt when applied to a 2,000 ohm load, specifically the base of a transistor. Laboratory measurements show the open circuit output to be three and one-half to four volts and thus consistantly meeting a specification requirement of one volt. The Wiegand wire 34 is not in physical contact with the two magnets but spaced from their sides by a small distance of 2.5 millimeters.

The flux lines illustrated in FIGS. 5 and 6 are somewhat hypothesized and have not yet been measured in detail. It should be understood that they are shown for illustrative purposes only. In FIG. 5, the flux lines are intended to represent the situation where a low reluctance element is not present adjacent to the working surface 12f of the pulser 12. The FIG. 5 drawing is intended primarily to illustrate this symmetry. When a low reluctance element, such as the element 20 of FIG. 2, is brought adjacent to the working surface 12f, the flux pattern is substantially changed in a fashion approximately suggested by the schematic of FIG. 6. As shown in FIG. 6, the flux lines 40 in part are coupled through the low reluctance element from one pole of each magnet to the other pole of the same magnet. When so coupled, the flux lines have a component that is in the reverse direction from that of FIG. 5. Thus the field at the wire 34 is reversed sufficiently to force the wire 34 to change state.

RESUME OF THE FUNCTIONING OF THE WIRE

Although the Wiegand wire 34 has been described elsewhere, a brief description is provided here to facilitate understanding of this disclosure.

The wire 34 has two magnetic states as illustrated in FIGS. 7 and 8. The manner in which the wire 34 is manufactured as well as a discussion of the nature of these two states may be found in the application Ser. No. 897,483 referred to above supplemented by U.S. Pat. No. 3,820,090 issued June 25, 1974 to John R. Wiegand. The preferred form of the wire 34 for use in this module 33 is disclosed in the patent application. The wire 34 is a ferrous material such as the vanadium-cobalt-iron alloy or the nickle-iron alloy described in said patent application and patent. The wire 34 typically has a diameter of 0.25 millimeters.

When the wire 34 is subjected to the field from the magnets 30, 32 (the FIG. 5 situation), it is magnetized and set into the state indicated in FIG. 7. In this state, the entire wire segment 34 is magnetized in a single direction and this state is termed the confluent state. When the field is distorted by the low reluctance element 20, then the wire 34 will switch into its reverse state. In the reverse state, a relatively magnetically hard shell portion 34s of the wire captures and reverses the polarity of the relatively magnetically soft core portion 34c. Accordingly, the flux 40 generated by the relatively hard shell portion 34s is coupled through the relatively soft core portion 34c and the flux pattern changes from that shown in FIG. 7 to that shown in FIG. 8. A discussion of the magnetically hard shell portion 34s and the magnetically soft core portion 34c may be found in the referenced patent application and referenced patent.

When the low reluctance element 20 is removed, the field reverts to cause the wire 34 to switch back into its confluent state (the state shown in FIG. 7). This change in the magnetic state of the wire causes the flux generated by the shell portion 34s that was coupled through the core 34c to complete its path outside of the wire 34.

In both cases where the wire switches state, the direction of flux 40 through the core reverses and generates an electric pulse in the coil 36 wrapped around the wire.

Although one embodiment of the pulser 12 has been described in some detail and various pulse generator embodiments have been illustrated, it should be understood that there are variations in the structure illustrated which are encompassed within the scope of the invention and it is intended that the appended claims cover these variations.

Some comment should be made with relation to the position of the module 33. As shown in FIGS. 5 and 6, the module 33 is positioned adjacent to the sides 30s, 32s of the two magnets. The module 33 is also positioned adjacent and rearward of the working surface 12f. In one example, the axis of the wire 34 is 1.5 millimeters back from the working surface 12f and 2.5 millimeters from the magnet sides 30s, 32s. This positioning has been found to provide effective and repeatable results and therefore is presently a preferred position for the module 33. It has been found that certain other positions for the module are not as effective in producing usable results. For example, positioning the module 33 immediately behind the two magnets 30, 32 while maintaining the module orientation shown in FIGS. 5 and 6 appears to provide no usable output. It is believed that the reason for this is that the configuration of the field when it is distorted by the proximity of the low reluctance element, such as the element 20, is quite complex and that the wire segment 34 must be positioned so that when the field has been distorted the field must contain a component that sufficiently reverses the net external field on the wire 34 as to result in the desired switch of state for the wire. Accordingly, applicant would point out that changing the position of the module within the pulser has to be tested on a case-by-case basis in order to determine if the desired state switch occurs.

What is claimed is:

1. A pulser for use in the generation of a pulse in response to magnetic field distortion comprising:

first and second magnets spaced apart from one another and oriented relative to one another so that a first pole of said first magnet and a second pole of said second magnet define a working surface of said pulser, the polarity of said magnets having opposite orientation so that said first pole of said first magnet and said second pole of said second magnet have opposite polarities, said magnets establishing a magnetic field between them, a Wiegand wire module having a predetermined position in the field between said magnets, said module including a Wiegand wire segment and a pickup coil, said first and second magnets and said module all being positioned rearward of said working surface of the pulser, the configuration of said magnetic field between said magnets distorting materially in response to a material change in the reluctance path provided adjacent to and forward of said working surface of the pulser, said position of said Wiegand wire in said field being such that said wire switches state in response to said material distortion of said field.

2. The pulser of claim 1 wherein said module is positioned along a plane adjacent a side of said magnets.

3. The pulser of claims 1 or 2 wherein said module is positioned along a plane adjacent said working surface.

4. The pulser of claims 1 or 2 wherein said magnets are high energy magnets.

5. The pulser of claim 3 wherein said magnets are samarium cobalt.

6. The pulser of claim 4 wherein said magnets are samarium cobalt.

7. A pulse generator comprising:

a pulser having a working surface, and a low reluctance element, said pulser and said element being movable relative to each other such that said element traverses across said working surface of said pulser, adjacent to and in front of said working surface, said pulser including first and second spaced apart magnets determining a magnetic field therebetween and a Wiegand wire module positioned in said magnetic field between said first and second magnets, said magnets and module all being positioned rearward of said working surface, said Wiegand wire module including a Wiegand wire segment and a pickup coil wrapped around said segment, said first and second magnets having essentially parallel magnetic axes and opposite polarities, a first pole of said first magnet having a first polarity and a second pole of said second magnet having a second polarity, said first pole of said first magnet and said second pole of said second magnet substantially defining said working surface of said pulser, the permeability of said low reluctance element being sufficient to materially distort said magnetic field between said magnets in the vicinity of said wire, when said element is adjacent said working surface, said wire switching state in response to said material distortion of said field.

8. The pulser of claim 7 wherein said module is positioned along a plane adjacent a side of said magnets.

9. The pulser of claims 7 or 8 wherein said module is positioned along a plane adjacent said working surface.

10. The pulser of claims 7 or 8 wherein said magnets are high energy magnets.

11. The pulser of claim 9 wherein said magnets are samarium cobalt.

12. The pulser of claim 10 wherein said magnets are samarium cobalt.

13. The method of generating a pulse in response to the switching of state of a Wiegand wire wherein the wire is provided in a module having a pickup coil wrapped around a segment of Wiegand wire comprising the steps of:

establishing a relatively intense magnetic field between first and second magnets spaced from one another and polarized in opposite directions from one another, deploying the Wiegand wire module in said field between said magnets and along a plane adjacent a side of said magnets, and bringing a low reluctance element adjacent to a plane defined by a south pole of said first magnet and a north pole of said second magnet to materially distort the configuration of the field in the vicinity of said module.

* * * * *